United States Patent
Aggarwal et al.

(10) Patent No.: US 8,801,857 B2
(45) Date of Patent: Aug. 12, 2014

(54) SELF-CENTERING SUSCEPTOR RING ASSEMBLY

(75) Inventors: Ravinder Aggarwal, Gilbert, AZ (US); Robert C. Haro, Gilbert, AZ (US)

(73) Assignee: ASM America, Inc., Phoenix, AZ (US)

( * ) Notice: Subject to any disclaimer, the term of this patent is extended or adjusted under 35 U.S.C. 154(b) by 852 days.

(21) Appl. No.: 12/263,345

(22) Filed: Oct. 31, 2008

(65) Prior Publication Data

US 2010/0107973 A1    May 6, 2010

(51) Int. Cl.
| | | |
|---|---|---|
| *C23C 14/50* | (2006.01) | |
| *C23C 16/458* | (2006.01) | |
| *B05C 13/02* | (2006.01) | |
| *H01L 21/67* | (2006.01) | |
| *H01L 21/687* | (2006.01) | |
| *H05B 6/10* | (2006.01) | |

(52) U.S. Cl.
CPC .......... *H05B 6/105* (2013.01); *H01L 21/67103* (2013.01); *H01L 21/68785* (2013.01)
USPC .......................................... 118/728; 118/500

(58) Field of Classification Search
USPC ....................................................... 118/728
See application file for complete search history.

(56) References Cited

U.S. PATENT DOCUMENTS

| | | |
|---|---|---|
| 3,407,783 A | 10/1968 | Capita |
| 3,549,847 A | 12/1970 | Clark et al. |
| 3,641,974 A | 2/1972 | Yamada et al. |
| 4,522,149 A | 6/1985 | Garbis et al. |
| 4,560,420 A | 12/1985 | Lord |
| 4,710,428 A | 12/1987 | Tamamizu et al. |
| 4,821,674 A | 4/1989 | deBoer et al. |
| 4,958,061 A | 9/1990 | Wakabayashi et al. |
| 4,978,567 A | 12/1990 | Miller |

(Continued)

FOREIGN PATENT DOCUMENTS

| | | |
|---|---|---|
| EP | 0339279 A2 | 11/1989 |
| EP | 0 448 346 A1 | 3/1991 |

(Continued)

OTHER PUBLICATIONS

International Preliminary Report on Patentability dated May 3, 2011 for International Patent Application No. PCT/US2009/059501, in 5 pages.

(Continued)

*Primary Examiner* — Dah-Wei D Yuan
*Assistant Examiner* — Stephen Kitt
(74) *Attorney, Agent, or Firm* — Knobbe Martens Olson & Bear LLP

(57) ABSTRACT

A self-centering susceptor ring assembly is provided. The susceptor ring assembly includes a susceptor ring support member and a susceptor ring supported on the susceptor ring support member. The susceptor ring support member includes at least three pins extending upwardly relative to the lower inner surface of the reaction chamber. The susceptor ring includes at least three detents formed in a bottom surface to receive the pins from the susceptor ring support member. The detents are configured to allow the pins to slide therewithin while the susceptor ring thermally expands and contracts, wherein the detents are sized and shaped such that as the susceptor ring thermally expands and contracts the gap between the susceptor ring and the susceptor located within the aperture of the susceptor ring remains substantially uniform about the entire circumference of the susceptor, and thereby maintains the same center axis.

9 Claims, 9 Drawing Sheets

(56) References Cited

U.S. PATENT DOCUMENTS

| | | |
|---|---|---|
| 4,990,374 A | 2/1991 | Keeley et al. |
| 5,033,407 A | 7/1991 | Mizuno et al. |
| 5,044,943 A | 9/1991 | Bowman et al. |
| 5,098,198 A | 3/1992 | Nulman et al. |
| 5,108,792 A | 4/1992 | Anderson et al. |
| 5,119,540 A | 6/1992 | Kong et al. |
| 5,119,541 A | 6/1992 | Ohmi et al. |
| 5,121,531 A | 6/1992 | Severns et al. |
| 5,156,820 A | 10/1992 | Wong et al. |
| 5,199,483 A | 4/1993 | Bahng |
| 5,200,157 A | 4/1993 | Toya et al. |
| 5,298,465 A | 3/1994 | Levy |
| 5,304,248 A | 4/1994 | Cheng et al. |
| 5,306,699 A | 4/1994 | Eddy |
| 5,308,645 A | 5/1994 | Zachman et al. |
| 5,332,442 A | 7/1994 | Kubodera et al. |
| 5,343,938 A | 9/1994 | Schmidt |
| 5,354,715 A | 10/1994 | Wang et al. |
| 5,356,486 A | 10/1994 | Sugarman et al. |
| 5,370,739 A | 12/1994 | Foster et al. |
| 5,383,971 A | 1/1995 | Selbrede |
| 5,393,349 A | 2/1995 | Ohkase |
| 5,403,401 A | 4/1995 | Haafkens et al. |
| 5,421,893 A | 6/1995 | Perlov |
| 5,444,217 A | 8/1995 | Moore et al. |
| 5,456,757 A | 10/1995 | Aruga et al. |
| 5,467,220 A | 11/1995 | Xu |
| 5,492,566 A | 2/1996 | Sumnitsch |
| 5,514,439 A | 5/1996 | Sibley |
| 5,527,393 A | 6/1996 | Sato et al. |
| 5,549,756 A | 8/1996 | Sorensen et al. |
| 5,551,985 A | 9/1996 | Brors et al. |
| 5,558,717 A | 9/1996 | Zhao et al. |
| 5,584,936 A | 12/1996 | Pickering et al. |
| 5,620,525 A | 4/1997 | van de Ven et al. |
| 5,645,646 A | 7/1997 | Beinglass et al. |
| 5,656,093 A | 8/1997 | Burkhart et al. |
| 5,683,518 A | 11/1997 | Moore et al. |
| 5,700,725 A | 12/1997 | Hower et al. |
| 5,738,165 A | 4/1998 | Imai |
| 5,803,977 A | 9/1998 | Tepman et al. |
| 5,834,737 A * | 11/1998 | Hirose et al. ................. 219/385 |
| 5,938,850 A | 8/1999 | Arami et al. |
| 6,020,212 A | 2/2000 | Mathis |
| 6,090,212 A | 7/2000 | Mahawili |
| 6,093,252 A | 7/2000 | Wengert et al. |
| 6,167,834 B1 | 1/2001 | Wang et al. |
| 6,402,850 B1 | 6/2002 | Beinglass et al. |
| 6,893,507 B2 | 5/2005 | Goodman et al. |
| 2010/0031884 A1 | 2/2010 | Aggarwal et al. |

FOREIGN PATENT DOCUMENTS

| | | |
|---|---|---|
| EP | 0445596 A2 | 9/1991 |
| EP | 0634785 A1 | 1/1995 |
| EP | 0669640 A1 | 8/1995 |
| EP | 0 766 289 A2 | 4/1997 |
| EP | 0840358 A2 | 5/1998 |
| GB | 2181458 A | 4/1987 |
| JP | 7-58039 | 3/1995 |
| JP | 2000-269310 | 9/2000 |
| JP | 2002-184843 | 6/2002 |
| JP | 2002-526915 | 8/2002 |
| KR | 10-2007-0098025 | 10/2007 |
| WO | WO9630713 * | 10/1996 |
| WO | WO 97/08743 | 3/1997 |

OTHER PUBLICATIONS

"Shaping the Future in Semiconductor Processing." Advertisement for Morton International, Inc., *Ceramic Solutions*. vol. 73, No. 7, Jul. 1994: advertisements (circa 1993).

Office Action in Chinese Application No. 200980142674.2, filed Oct. 5, 2009, dated Nov. 1, 2012.

* cited by examiner

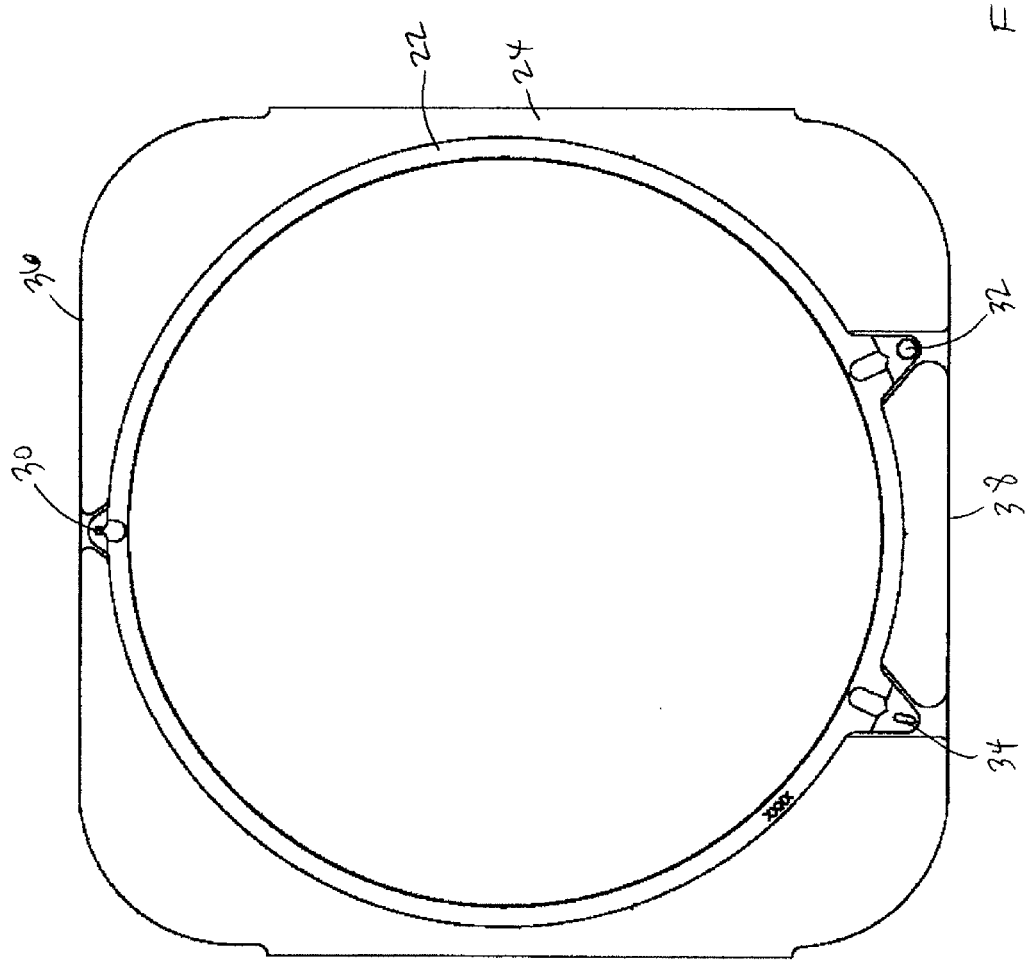

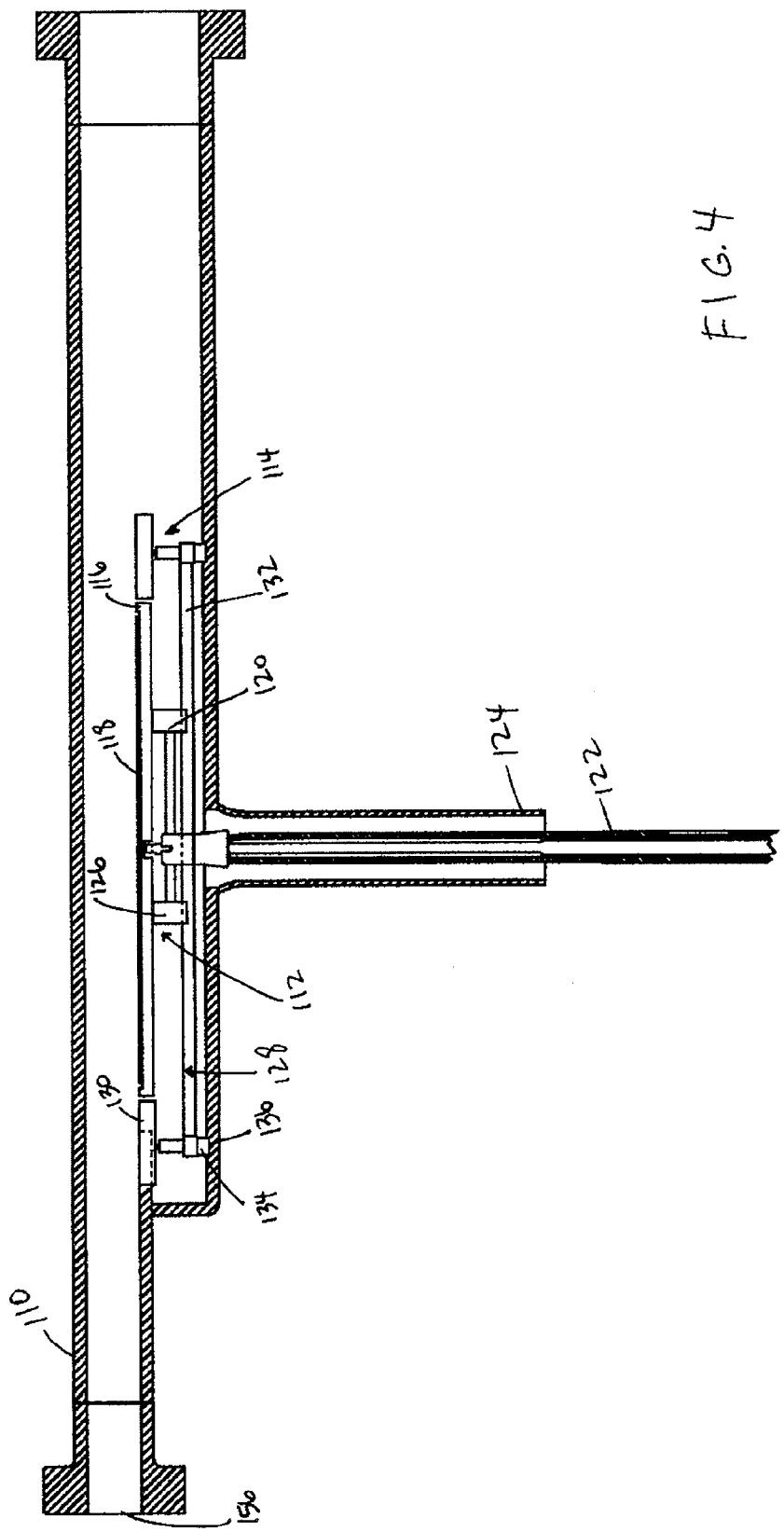

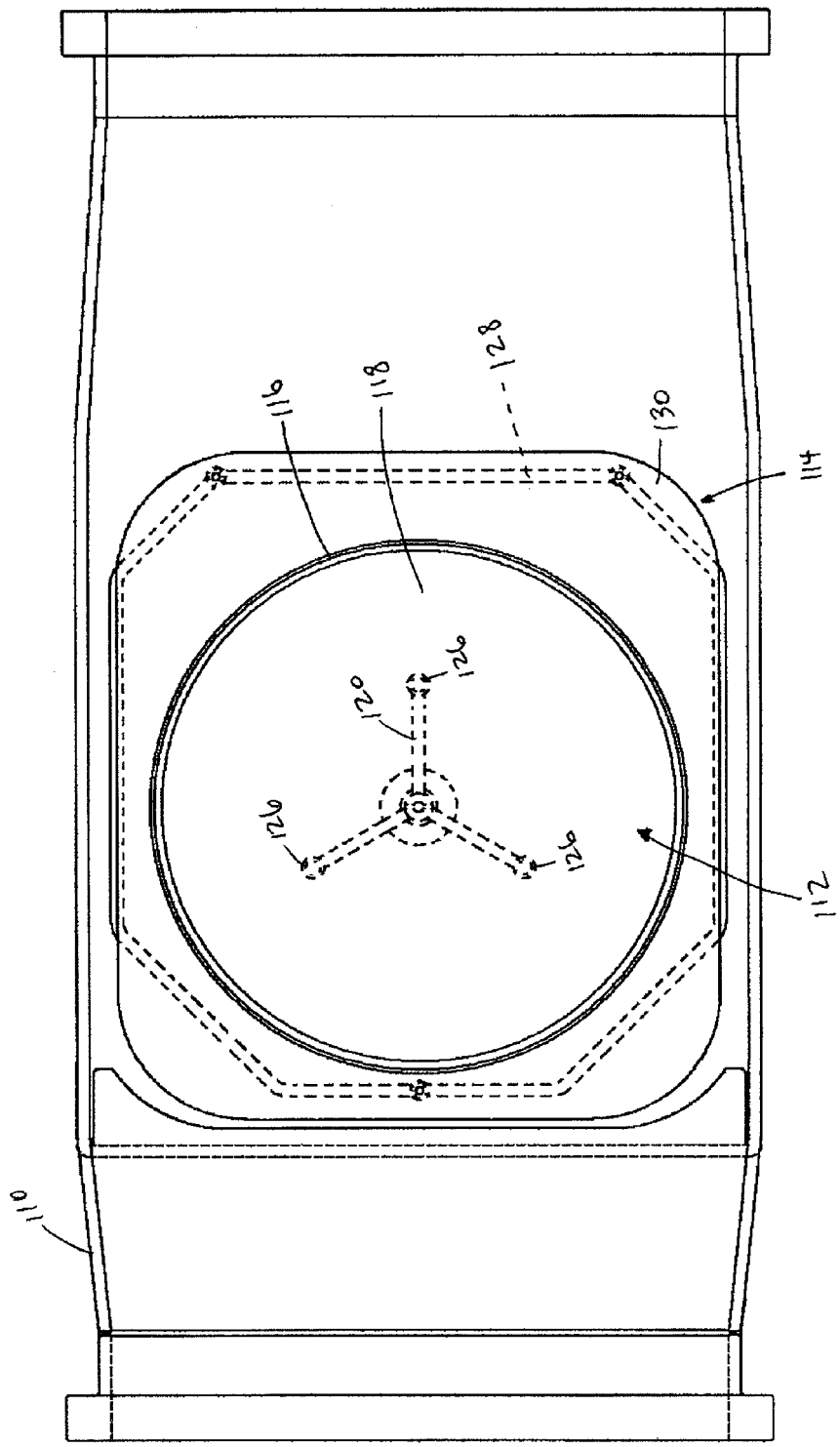

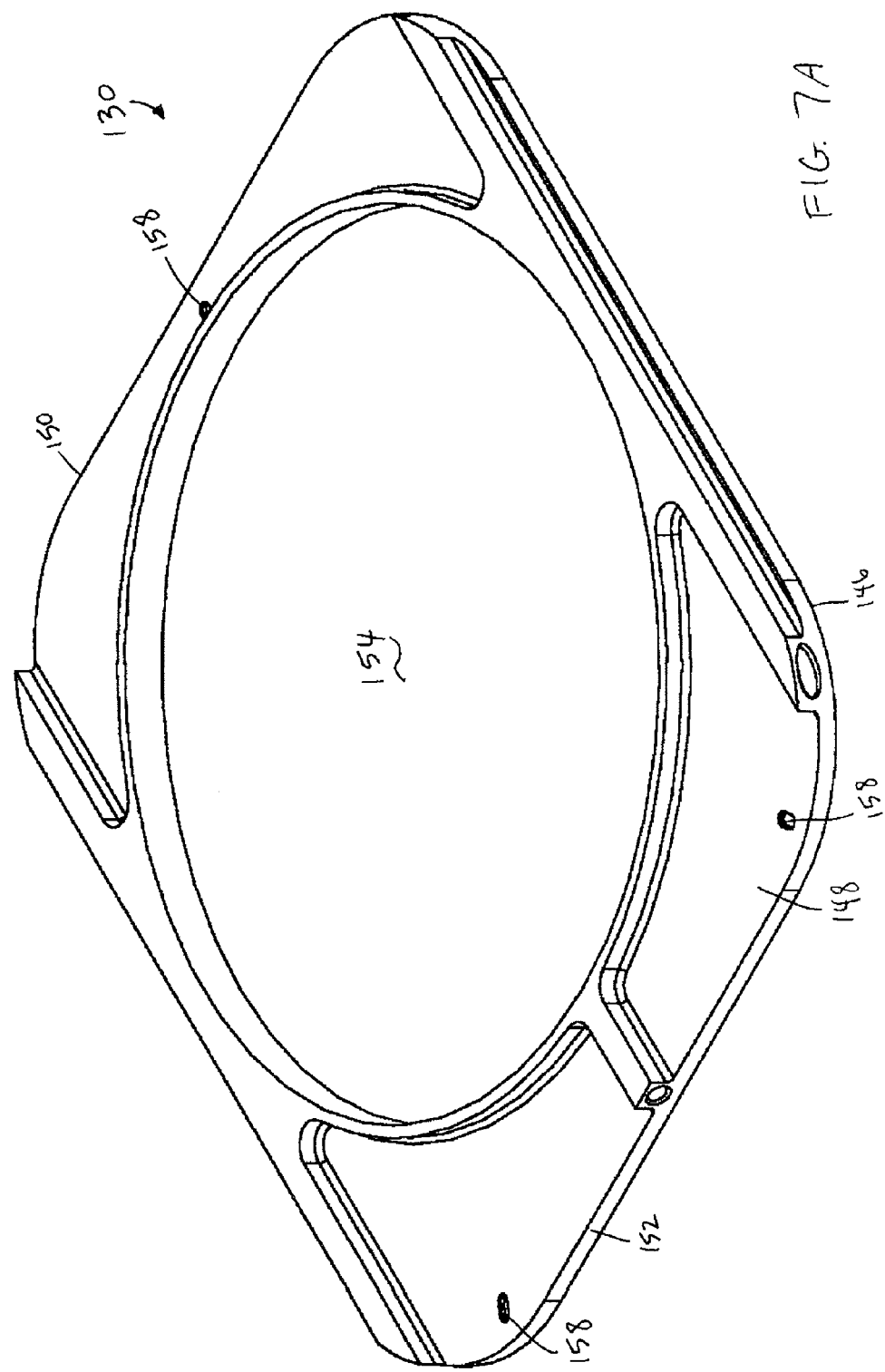

SELF-CENTERING SUSCEPTOR RING ASSEMBLY

FIELD OF THE INVENTION

This invention is related to semiconductor processing tools, and more particularly, to a susceptor ring assembly surrounding a susceptor upon which a substrate is located during a semiconductor manufacturing process.

BACKGROUND OF THE INVENTION

In the processing of semiconductor devices, such as transistors, diodes, and integrated circuits, a plurality of such devices are typically fabricated simultaneously on a thin slice of semiconductor material, termed a substrate, wafer, or workpiece. In one example of a semiconductor processing step during manufacture of such semiconductor devices, the substrate or other workpiece is typically transported into a reaction chamber in which a thin film, or layer, of a material is deposited on an exposed surface of the substrate. Once the desired thickness of the layer of material has been deposited, the substrate may be further processed within the reaction chamber or transported out of the reaction chamber for further processing.

The substrate is typically transferred into the reaction chamber by way of a wafer handling mechanism. The wafer handling mechanism lifts the substrate from a position outside the reaction chamber and inserts the substrate into the reaction chamber through a valve or door formed in a wall of the reaction chamber. Once the substrate is transferred into the reaction chamber, the substrate is dropped onto a susceptor. After the substrate is received on the susceptor, the wafer handling mechanism is withdrawn from the reaction chamber and the valve is closed such that processing of the substrate can begin. In an embodiment, a susceptor ring is located adjacent to, and surrounds, the susceptor upon which the substrate is disposed during processing. Such rings can serve to minimize heat loss from the edge of the wafer/susceptor during processing and/or house components such as temperature sensors.

FIGS. 1-3 illustrates a known reaction chamber 10 and substrate support assembly 12 typically used in the Epsilon® tools produced by ASM America, Inc. of Phoenix, Ariz. The substrate support assembly 12 is configured to receive and support a substrate 18 within the reaction chamber 10 when the substrate 18 is being processed. The substrate support assembly 12 includes a susceptor support member 14 and a susceptor 16. A susceptor ring assembly 20 surrounds the susceptor 16 within the reaction chamber 10. The susceptor ring assembly 20 provides a small gap between the inwardly-directed edge of the susceptor ring and the outwardly-directed edge of the susceptor. The susceptor ring assembly 20 can absorb radiant energy to reduce or eliminate heat loss from the outer edge of the susceptor 16 and substrate 18 during processing. The susceptor ring assembly 20 typically used in the Epsilon® tool includes a susceptor ring, which includes a lower susceptor ring 22 and an upper susceptor ring 24, and a susceptor ring support member 26.

During processing of a substrate within a reaction chamber, the temperature within the reaction chamber varies and may have a temperature range between room temperature and about 1200° C. When the temperature within the reaction chamber is raised and/or lowered, the various components within the reaction chamber thermally expand or contract accordingly. The commonly known substrate support assembly 12 and susceptor ring assembly 20 illustrated in FIGS. 1-3 are located within the reaction chamber 10 and thermally expand and/or contract as the temperature within the reaction chamber 10 is raised or lowered. The susceptor support member 14 and the susceptor ring support member 26 are typically formed of an insulating material, e.g., quartz, and the susceptor 16, lower susceptor ring 22, and upper susceptor ring 24 are formed of a heat-absorbing material, e.g., SiC-coated graphite. The susceptor ring support member 26 includes a plurality of pins 28 that are received by the susceptor ring to positively locate the susceptor ring within the reaction chamber 10.

The lower susceptor ring 22, as shown in the bottom plan view of FIG. 3, includes a first aperture 30, a second aperture 32, and a third aperture 34 formed therein. The apertures are configured to receive a pin 28 (see FIG. 1) extending from the susceptor ring support member 26. The first aperture 30 is located adjacent to the leading edge 36 of the upper support ring 24, closest to the gas inlets, and the second and third apertures 32, 34 are located adjacent to the trailing edge 38 of the upper support ring 24, closest to the gas exhaust. The first aperture 30 is formed as a circular hole through a projection extending from the lower susceptor ring 22. The first aperture 30 is sized to provide a snug fit between the hole and one of the pins 28 extending from the susceptor ring support member 26. The second aperture 32 is formed as a circular hole that is larger than the outer diameter of the pin 28 received therein. The third aperture 34 is formed as an elongated slot configured to receive another of the pins 28 therein.

As the temperature increases in the reaction chamber 10 during processing of a substrate 18, the lower and upper susceptor rings 22, 24 thermally expand. The susceptor 16, lower susceptor ring 22, and upper susceptor ring 24 are typically formed of graphite, and the susceptor support member 14, susceptor ring support member 26, and pins 28 are typically formed of quartz. The components (16, 22, and 24) formed of graphite have a significantly larger coefficient of thermal expansion relative to the coefficient of thermal expansion of the components (14, 26, and 28) formed of quartz, wherein the graphite components expand more than the quartz parts in response to the same temperature change. In order to accommodate these differences in thermal expansion, the second and third apertures 32, 34 are larger than the corresponding pins 28 received therein, the lower and upper susceptor rings 22, 24 are able to freely thermally expand such that as the susceptor ring expands or contracts, the pins 28 translate within the second and third apertures 32, 34. However, because the first aperture 30 provides a snug fit with a corresponding pin 28, the susceptor ring is prevented from thermally expanding away from the susceptor near the leading edge 36 of the upper susceptor ring 24. The leading portion of the susceptor ring is substantially pinned relative to the susceptor as the trailing portion of the susceptor ring is free to thermally expand. The lack of movement of the susceptor ring due to thermal expansion near the leading edge of the susceptor ring typically reduces the gap between the susceptor ring and the susceptor near the leading edge while the gap between the susceptor ring and the susceptor near the trailing edge increases.

As a result, the restrained movement of the leading portion of the susceptor ring relative to the susceptor creates uneven gap spacing between the susceptor ring and the susceptor. The uneven gap spacing between the susceptor ring and the susceptor at the various locations about the susceptor may cause temperature non-uniformities on the susceptor and the substrate being processed. Further, if the susceptor ring is not properly aligned relative to the susceptor, the gap between the susceptor ring and the susceptor may be reduced to the point where the susceptor ring contacts the susceptor. Because the susceptor typically rotates about its vertical axis during processing, any contact between the susceptor and the ring can create particles that can become deposited on the surface of the wafer or other problems with the processing of the substrate.

A need therefore exists for a self-centering susceptor ring that is capable of thermally expanding evenly about a susceptor such that the gap between the susceptor ring and the susceptor expands or contracts substantially evenly about the susceptor.

SUMMARY OF THE INVENTION

In one aspect of the present invention, a self-centering susceptor ring assembly is provided. The self-centering support ring assembly includes a susceptor ring support member and at least three pins extending from the susceptor ring support member. The self-centering support ring assembly also includes a susceptor ring supportable upon the susceptor ring support member. The susceptor ring includes at least three detents formed into a bottom surface of the susceptor ring and an aperture having a center point. Each of the detents receives one of the pins of the susceptor ring support member. Thermal expansion and contraction of the susceptor ring and the susceptor ring support member causes the pins to slide within the detents such that an edge forming the aperture remains substantially centered about the center point of the aperture during thermal expansion and contraction of the susceptor ring.

In another aspect of the present invention, a semiconductor processing system is provided. The semiconductor processing system includes a reaction chamber, a substrate support assembly, and a self-centering susceptor ring assembly. The substrate support assembly and the self-centering susceptor ring assembly are located within the reaction chamber. The self-centering susceptor ring assembly includes a susceptor ring support member operatively connected to a lower surface of the reaction chamber. The susceptor ring support member includes at least three pins protruding away from the lower surface of the reaction chamber. The susceptor ring is supportable on the susceptor ring support member. The susceptor ring has at least three detents formed into a bottom surface thereof, and each of the detents is configured to receive one of the pins. The pins are slidable within the detents as the susceptor ring thermally expands and contracts to maintain the substrate support assembly centered within the self-centering susceptor ring assembly.

In yet another aspect of the present invention, a self-centering susceptor ring assembly for use in a semiconductor processing tool is provided. The self-centering susceptor ring assembly includes a susceptor ring support having at least three pins extending in the same direction from at least one side member. Tips of the pins form a substantially planar support. The self-centering susceptor ring assembly also includes a susceptor ring having at least three detents formed therein for receiving a corresponding pin. During thermal expansion and contraction of the susceptor ring, thermal expansion or contraction of the susceptor ring causes the pins to change relative location within the detents to allow the susceptor ring to remain substantially centered about a center point.

In accordance with another aspect of the invention, a susceptor ring is provided for use in a self-centering susceptor ring assembly. The susceptor ring includes an upper surface and a lower surface defining a thickness therebetween. An aperture is formed through the thickness, and the aperture has a centerpoint. At least three detents are formed into the lower surface. The detents are elongated slots aligned radially relative to the center point.

Advantages of the present invention will become more apparent to those skilled in the art from the following description of the embodiments of the invention which have been shown and described by way of illustration. As will be realized, the invention is capable of other and different embodiments, and its details are capable of modification in various respects. Accordingly, the drawing(s) and description are to be regarded as illustrative in nature and not as restrictive.

BRIEF DESCRIPTION OF THE DRAWINGS

FIG. 3 is a bottom plan view of a susceptor ring commonly known in the prior art;

FIG. 4 is a cross-sectional side view of a reaction chamber having a self-centering susceptor ring assembly in accordance with an embodiment;

FIG. 5 is a top plan view of the reaction chamber shown in FIG. 4;

FIG. 7A is a bottom isometric view of an exemplary embodiment of a susceptor ring;

DETAILED DESCRIPTION OF THE PREFERRED EMBODIMENT

Figure 1:
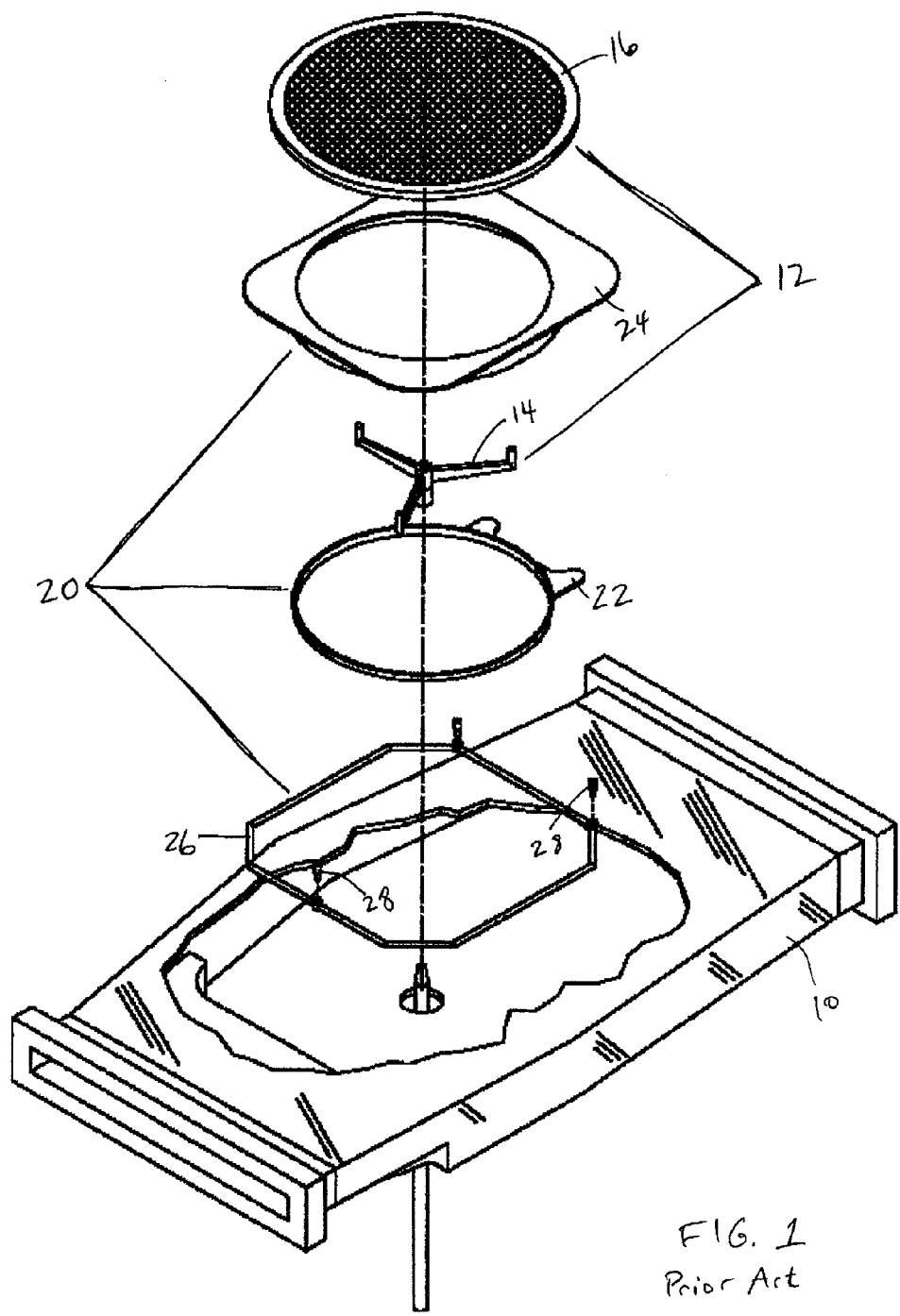
FIG. 1 is an exploded view of a reaction chamber commonly known in the prior art.
Figure 2:
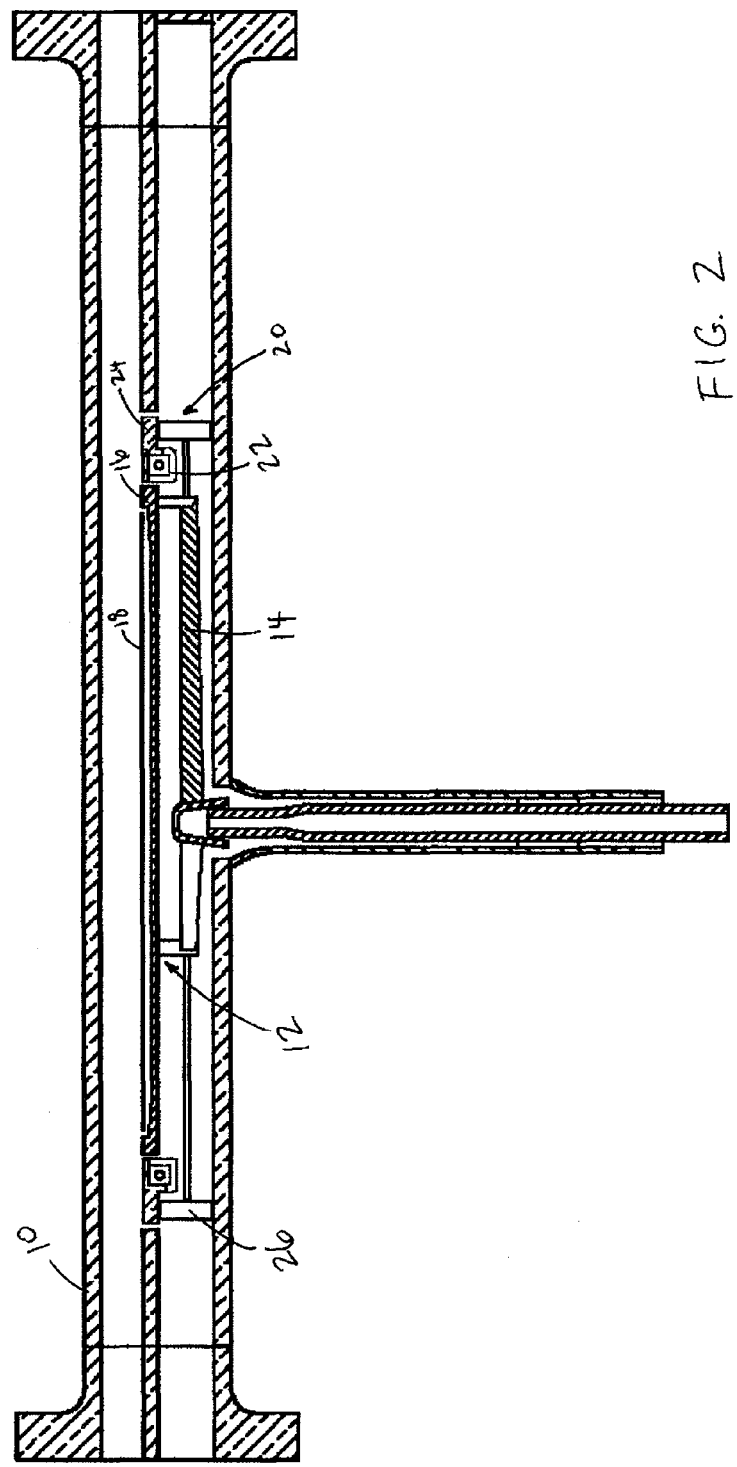
FIG. 2 is cross-sectional side view of the reaction chamber shown in FIG. 1.

Referring to FIGS. 4-5, an embodiment of a reaction chamber 110, a substrate support assembly 112, and a self-centering susceptor ring assembly 114 of a semiconductor processing system are shown. The reaction chamber 110 is illustrated as a horizontal flow, cold-wall chamber. It should be understood by one skilled in the art that the reaction chamber is an exemplary embodiment for illustrative purposes only, and the substrate support assembly 112 and the susceptor ring assembly 114 may be used in other types of semiconductor processing chambers. In an embodiment, the reaction chamber 110 is formed of quartz to allow radiant energy to be transmitted therethrough such that the radiant heat can be absorbed by components of the substrate support assembly 112 and/or the susceptor ring assembly 114.

The substrate support assembly 112 is located at least partially within the reaction chamber 110, as illustrated in FIGS. 4-5. In an embodiment, the substrate support assembly 112 includes a susceptor 116 configured to receive a substrate 118, a susceptor support member 120, a shaft 122, and a motor (not shown). The motor is located external to the reaction chamber 110 and is operatively connected to the shaft 122. The shaft 122 is located within a tube 124 depending from the lower surface of the reaction chamber 110. The susceptor support member 120 is operatively connected to the shaft 122 opposite the motor. The susceptor support member 120 includes a plurality of feet 126 that are received by the susceptor 116 to operatively connect the susceptor 116 to the susceptor support member 120. In operation, the motor is configured to rotate the shaft 122, thereby causing the susceptor support member 120 and the susceptor 116 to correspondingly rotate therewith.

As shown in FIGS. 4-5, an embodiment of a self-centering susceptor ring assembly 114 is located within the reaction chamber 110 and surrounds the substrate support assembly 112. In an embodiment, the susceptor ring assembly 114 includes a susceptor ring support member 128 and a susceptor ring 130 supported on the susceptor ring support member 128. The susceptor ring support member 128 contacts and extends upwardly from the lower surface of the reaction chamber 110, and the susceptor ring 130 is located on the susceptor ring support member 128 such that the susceptor ring 130 is disposed about the outer edge of the susceptor 116 to assist in compensating for the heat loss from the outer edge of the susceptor 116 and substrate 118.

Figure 6A:
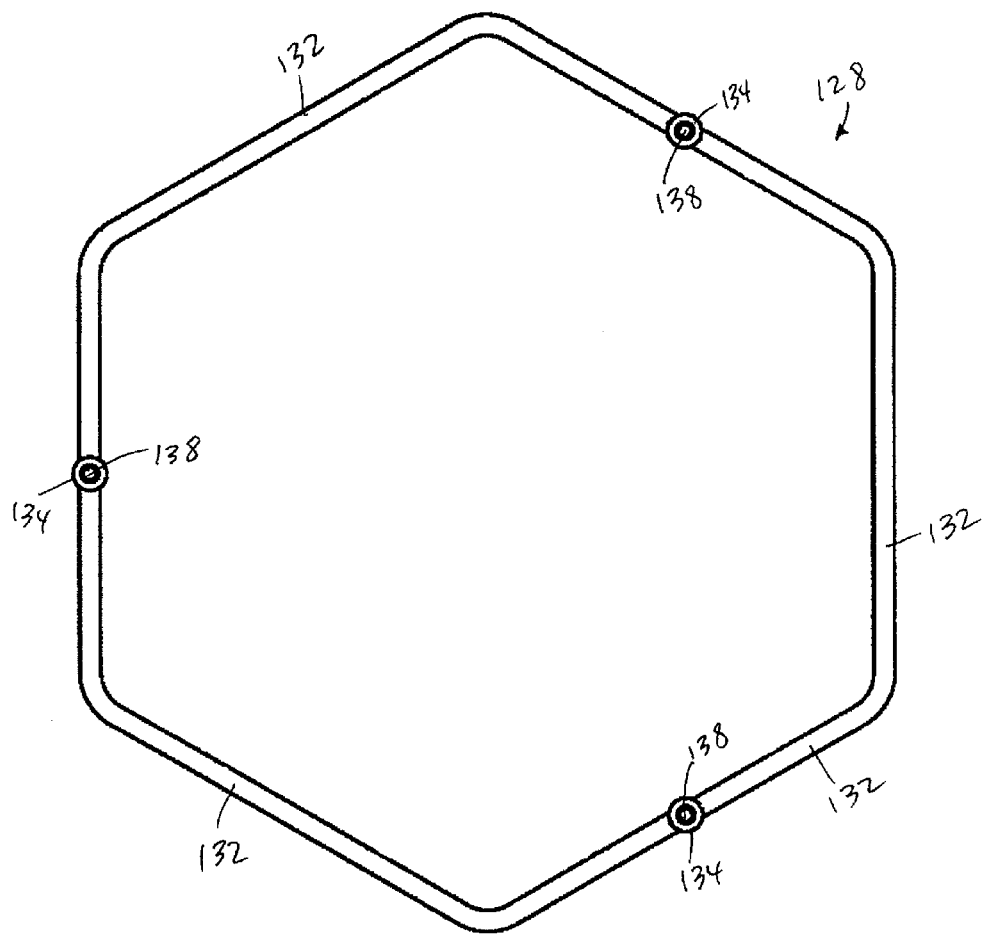
FIG. 6A is a top plan view of an embodiment of a susceptor ring support member.
Figure 6B:
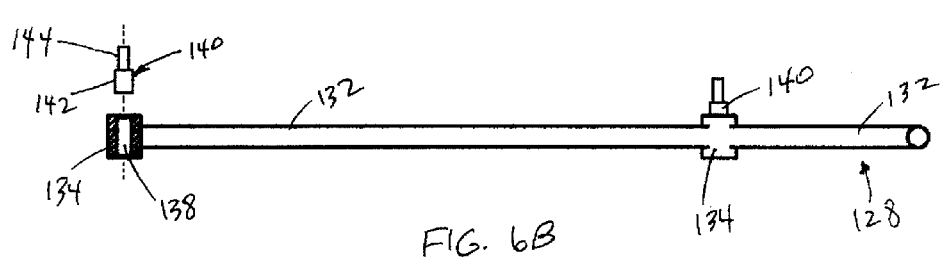
FIG. 6B is a side elevational view of the susceptor ring support member shown in FIG. 6A.

In an embodiment, the susceptor ring support member 128 is formed as a substantially hexagonal member, as shown in FIGS. 6A-B. It should be understood by one skilled in the art that the susceptor ring support member 128 may also be formed as a square, triangular, rectangular, circular, oval, pentagonal member, or the like. It should also be understood by one skilled in the art that the susceptor ring support member 128 may be formed with any number of side members 132, wherein each side member has the same or a different length, or the susceptor ring support member 128 may be formed having a single side member 132 such as circular- or oval-shaped. In an embodiment, the susceptor ring support member 128 is formed of a thermally insulating material, such as quartz. In another embodiment, the susceptor ring support member 128 is formed of a thermally absorbing material, such as ceramic-coated graphite. It should be understood by one skilled in the art that the susceptor ring support member 128 can be formed of any material that is substantially inert with respect to the process gases introduceable into the reaction chamber 110 during processing of a substrate and is suitable to withstand high temperatures.

The susceptor ring support member 128 also includes a plurality of locating members 134 attached to the side members 132, as illustrated in FIGS. 6A-6B. In an embodiment, the susceptor ring support member 128 includes three locating members 134 spaced about 120° apart relative to each other. In another embodiment, four locating members 134 are located about 90° apart relative to each other. In a further embodiment, three locating members 134 are spaced unevenly apart relative to each other about the susceptor ring support member 128. It should be understood by one skilled in the art that the susceptor ring support member 128 may include any number of locating members 134 attached thereto, and the locating members 134 may be spaced apart in any manner relative to each other. In an embodiment, the locating members 134 are integrally formed with the side members 132 to form the susceptor ring support member 128. In another embodiment, the locating members 134 are formed separately from the side members 132 and then operatively attached thereto.

In an embodiment, the locating members 134 extend from the side members 132 in a substantially perpendicular manner, as shown in FIGS. 6A-6B. Each locating member 134 extends from both the upper and lower surfaces of the side member 132 to which the locating member 134 is connected. When located within the reaction chamber 110, the lower portion of each locating member 134 of the susceptor ring support member 128 is received within a recess 136 (FIG. 4) formed in the lower surface of the reaction chamber 110. This connection between the susceptor ring support member 128 and the reaction chamber 110 prevents rotation or movement of the susceptor ring support member 128 relative to the reaction chamber 110 while providing a stable base upon which the susceptor ring 130 is supported. Each locating member 134 includes an aperture 138 formed through the thickness thereof. The aperture 138 is aligned in a substantially perpendicular manner relative to the plane formed by the side members 132 of the susceptor ring support member 128. The aperture 138 may be a through-hole or a blind hole.

In an embodiment, a pin 140 is inserted into each of the apertures 138 formed in the locating members 134, as shown in FIGS. 6A-6B. In another embodiment, the pins 140 are integrally formed with the side members 132 as a single piece, with or without the locating members 134. In an embodiment, the pin 140 includes a body 142 and a contact member 144, wherein the contact member 144 extends from the body 142. In one embodiment, at least a portion of the body 142 is inserted into an aperture 138 for assembly such that at least a portion of the body 142 and the entire contact member 144 extends from the locating member 134. In another embodiment, the entire body 142 is disposed within an aperture 138 such that at least a portion of the contact member 144 extends from the locating member 134. The tip of the contact member 144 of each pin 140 is configured to be received by the susceptor ring 130, thereby providing a connection between the susceptor ring support member 128 and the susceptor ring 130 (FIG. 4). In an embodiment, the tip of each pin 140 extends substantially the same distance above the side members 132 of the susceptor ring support member 128, thereby providing a substantially horizontal planar support upon which the susceptor ring 130 is mountable. It should be understood by one skilled in the art that although it is preferred that the tips of the pins 140 provide a substantially horizontal planar support for the susceptor ring 130, the tips of the pins 140 may also be configured to provide a non-horizontal, or slanted, planar support, or a non-planar support, for the susceptor ring 130. In an embodiment, the pins 140 and the contact members 144 are formed of quartz, but it should be understood by one skilled in the art that the pins 140 and contact members 144 can be formed of any other material substantially inert to the process gases introduced into the reaction chamber. The pins 140 are configured to provide structural support to the susceptor ring 130 while allowing the susceptor ring 130 to freely thermally expand and contract.

Figure 7C:
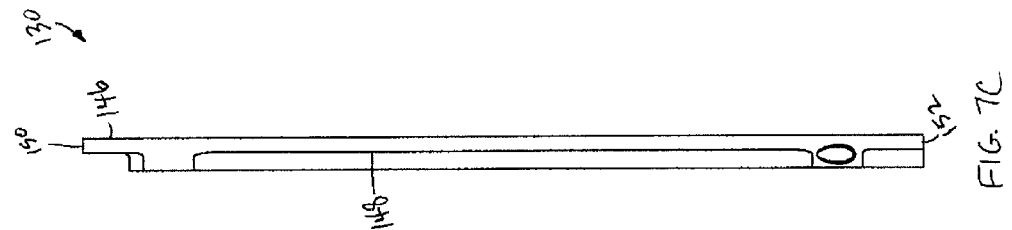
FIG. 7C is a side elevational view of the susceptor ring shown in FIG. 7A.
Figure 7B:
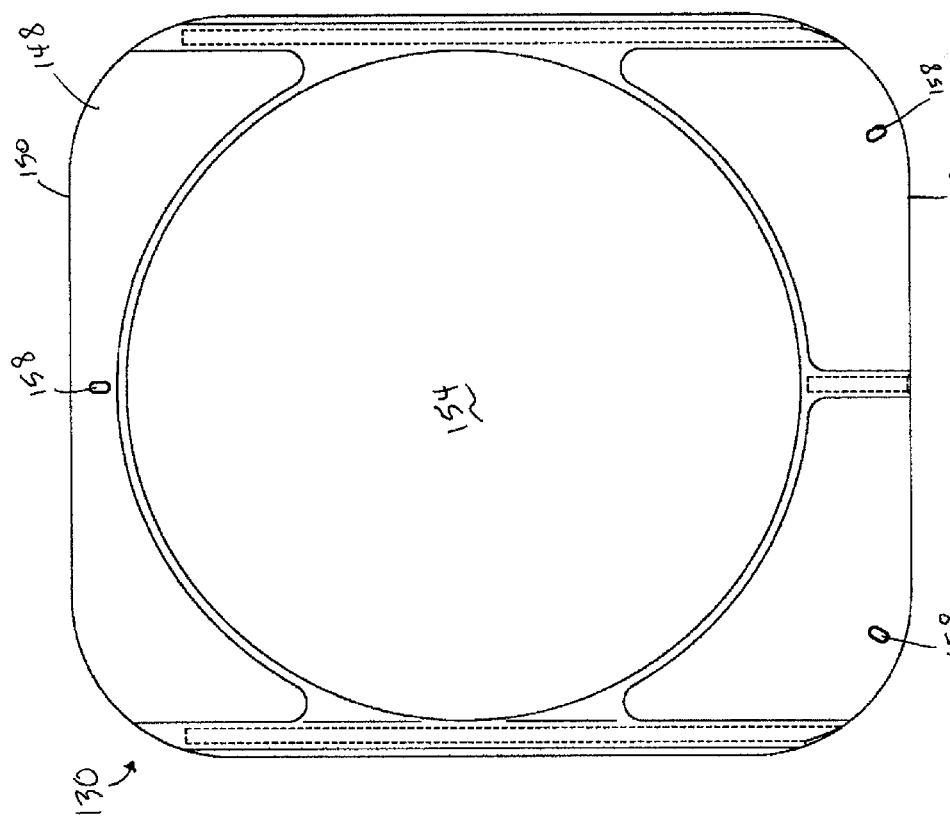
FIG. 7B is a bottom plan view of the susceptor ring shown in FIG. 7A.
Figure 8:
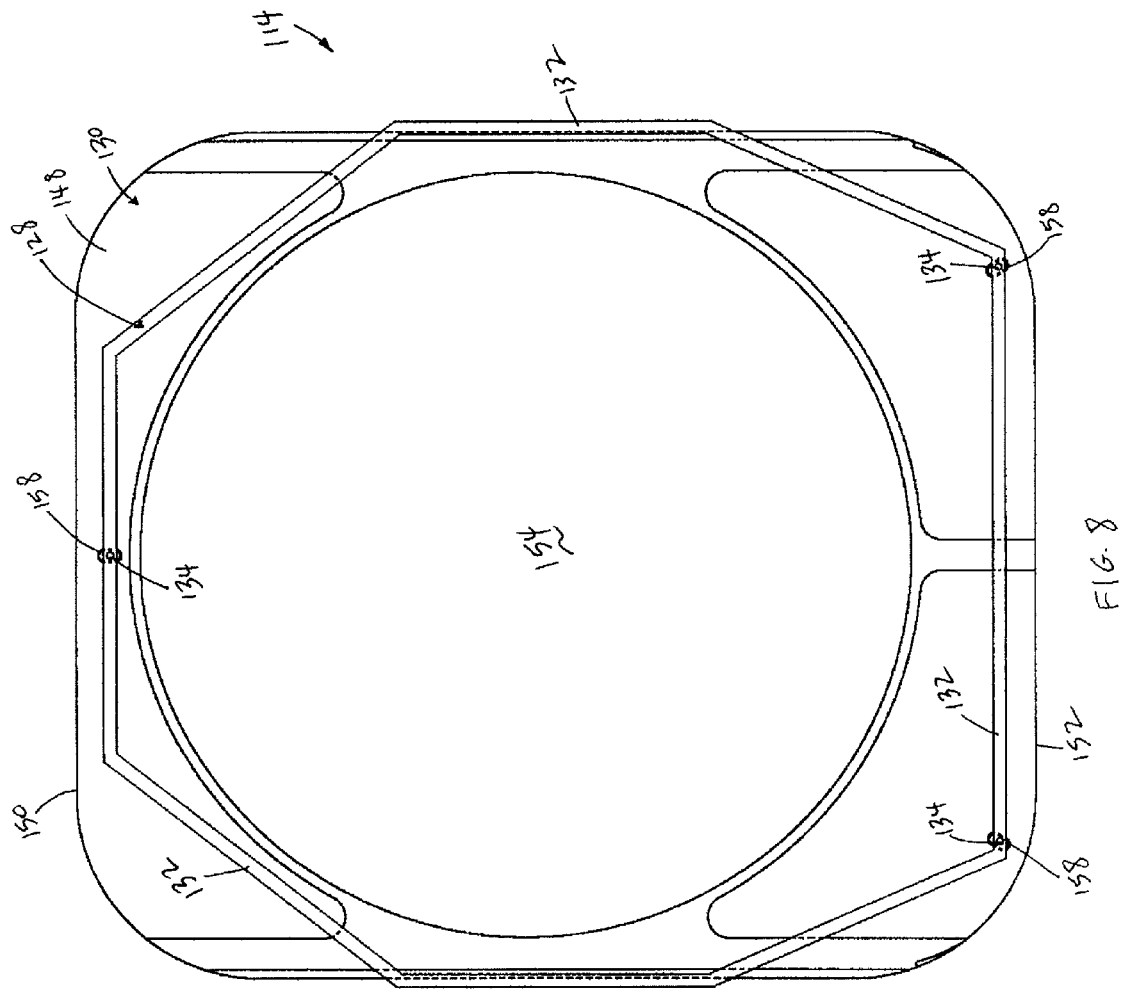
FIG. 8 is a bottom plan view of an embodiment of a self-centering susceptor ring assembly.

As illustrated in FIGS. 7A-7C, an embodiment of a susceptor ring 130 includes a lower surface 148, a leading edge 150 for placement closest to the chamber's gas inlets, a trailing edge 152 for placement closest to the chamber's gas exhaust, and an aperture 154 formed through the thickness. In an embodiment, the susceptor ring 130 is formed of graphite. It should be understood by one skilled in the art that the susceptor ring 130 may be formed of any material that is inert with respect to the process gases introduceable into the reaction chamber 110 while being capable of absorbing and emitting radiant energy at the elevated temperatures used to process substrates. It should also be understood by one skilled in the art that the susceptor ring 130 shown in FIGS. 7A-7B is an exemplary embodiment for ease of reference and description thereof, but it should be understood by one skilled in the art that the susceptor ring 130 can be formed of any number of pieces or formed of any type of material suitable for use in processing substrates. In the illustrated embodiment, the susceptor ring 130 is formed of a material different from the susceptor ring support member 128 such that the coefficient of thermal expansion of the susceptor ring 130 is different than the coefficient of thermal expansion of the susceptor ring support member 128. For example, when the susceptor ring 130 is formed of graphite and the susceptor ring support member 128 is formed of quartz, the susceptor ring 130 will expand a greater amount for a given temperature change relative to the susceptor ring support member 128 when heated.

When installed within the reaction chamber 110, as illustrated in FIG. 4, the lower surface 148 of the susceptor ring 130 is directed toward the lower interior surface of the reaction chamber 110, the leading edge 150 of the susceptor ring 130 is directed toward the inlet end 156 of the reaction chamber 110, and the edge of the susceptor ring 130 defining the aperture 154 therein is adjacent to the outer edge of the susceptor 116. The susceptor ring 130 is configured to absorb radiant heat in the same manner as the susceptor 116 upon which the substrate 118 is supported during processing. During processing, the susceptor 116 and the substrate 118 tend to lose heat from the outer edges thereof. The susceptor ring 130 is located immediately adjacent to the outer edge of the susceptor 116 in a spaced-apart manner, thereby preventing contact between the susceptor 116 and the susceptor ring 130 while compensating for a significant portion of the heat loss from the outer edge that the susceptor 116 and substrate 118 would otherwise experience. The improved self-centering susceptor ring assembly is configured to maintain a substantially even spacing between the aperture 154 of the susceptor ring 130 and the outer edge of the susceptor 116 while the temperature of the susceptor 116, susceptor ring 130, and the substrate 118 change during processing. The spacing allows the susceptor 116 to rotate during processing without rubbing and causing particle generation.

In an embodiment, the susceptor ring 130 includes three detents 158 formed into the lower surface 148, as illustrated in FIGS. 7A-7B. In another embodiment, the susceptor ring 130 includes more than three detents 158 formed into the lower surface 148. Each detent 158 formed in the susceptor ring 130 is configured to receive a contact member 144 of a pin 140 extending from a locating member 134 of the susceptor ring support member 128 for locating and supporting the susceptor ring 130 within the reaction chamber 110. It should be understood by one skilled in the art that the susceptor ring 130 should include a minimum of three detents 158 formed in the bottom surface to provide a stable connection between the susceptor ring 130 and the susceptor ring support member 128.

The susceptor ring support member 128 is configured to support the susceptor ring 130 at a spaced-apart relationship relative to the lower surface of the reaction chamber 110 as well as maintain the susceptor ring 130 in a substantially fixed location relative to the susceptor 116, as illustrated in FIGS. 4-5. The length of the pins 140 extending from the susceptor ring support member 128 provides a pre-determined spacing between the lower surface of the reaction chamber 110 and the upper surface 146 (FIG. 7C) of the susceptor ring 130. Note that in other arrangements the lower surface need not represent the floor of the reaction chamber. Because the height of the susceptor 116 within the reaction chamber 110 may vary from tool to tool or from model to model, the length of the pins 140 is modifiable to allow the upper surface 146 of the susceptor ring 130 to be properly aligned relative to the susceptor 116. In an embodiment, the pins 140 are removable from the apertures 138 of the locating members 134 of the susceptor ring support member 128, thereby allowing the pins 140 to be removed and reworked to provide a particular spacing between the lower surface of the reaction chamber 110 and the susceptor ring 130. In another embodiment, the pins 140 are replaceable such that the pins 140 can be removed and replaced with pins 140 of a different length, thereby modifying the spacing between the lower surface of the reaction chamber 110 and the susceptor ring 130.

In an embodiment, each of the detents 158 is formed as an elongated slot, as shown in FIG. 7B. It should be understood by one skilled in the art that the detents 158 can be formed as any shape sufficient to receive the tip of a pin 140 extending from the susceptor ring support member 128. It should also be understood by one skilled in the art that all of the detents 158 can be formed as the same shape, at least one detent 158 may be formed having a different shape than the other detents 158, or each detent 158 may be formed as a different shape than all the other detents 158, provided that each of the detents 158 is configured to allow the pin 140 received therein to translate in a substantially radial manner within the detent 158 relative to the center of the aperture 154. In an embodiment, each of the detents 158 extends into only a portion of the thickness of the susceptor ring 130, e.g., as blind slots. In another embodiment, each of the detents 158 extends through the entire thickness of the susceptor ring 130, i.e., as through-slots. It should be understood by one skilled in the art that the detents 158 are configured to receive a pin 140 extending from the susceptor ring support member 128, wherein the contact member 144 of the pin 140 contacts at least one surface of the corresponding detent 158 including the sides and/or the base surface of the detent 158.

In the exemplary embodiment illustrated in FIG. 7B, the detent 158 located adjacent to the leading edge 150 of the susceptor ring 130 and is oriented in a substantially radial manner relative to the center of the aperture 154 formed in the susceptor ring 130. The detents 158 located adjacent to the trailing edge 152 of the susceptor ring 130 are oriented at an angle relative to the detent 158 located adjacent to the leading edge 150 and are likewise oriented in a substantially radial manner relative to the center of the aperture 154 formed in the susceptor ring 130. It should be understood by one skilled in the art that the orientation of the detents 158 relative to each other may vary depending upon the number and location of the detents 158 formed in the susceptor ring 130, but each detent 158 should be configured to allow the pin 140 received therein to translate or slide in a substantially radial manner within the detent 158 relative to the center of the aperture 154. The detents 158 are configured to receive a pin 140 for maintaining contact between the susceptor ring 130 and the susceptor ring support member 128 while allowing the susceptor ring 130 to freely and substantially uniformly thermally expand and contract as the temperature of the susceptor ring 130 increases or decreases. The detents 158 are generally aligned in a radial manner relative to the center point of the aperture 154 formed in the susceptor ring 130.

In an exemplary embodiment, the susceptor ring 130 is formed of graphite and the susceptor ring support member 128, including the pins 140 and contact members 144 thereof, is formed of quartz such that the coefficient of thermal expansion of the susceptor ring 130 is different than the coefficient of thermal expansion of the susceptor ring support member 128. Graphite components are generally coated with an inert material like SiC or other ceramic, but the graphite tends to dominate the mass and thus the coefficient of thermal expansion of such components. As such, as the temperature within the reaction chamber 110 increases, the susceptor ring 130 and the susceptor ring support member 128 thermally expand, but the susceptor ring 130 thermally expands more than the susceptor ring support member 128. The thermal expansion of the outer edges of the susceptor ring 130 expands away from the center of the aperture 154 while the inner edge defining the aperture 154 expands inwardly toward the center of the aperture 154. Because the susceptor 116 thermally expands within the aperture 154 of the susceptor ring 130 in a similar manner, the gap spacing between the outer edge of the susceptor 116 and the inner surface of the susceptor ring 130 defining the aperture 154 is reduced. Due to the different coefficients of thermal expansion between the susceptor ring 130 and the susceptor ring support member 128, the susceptor ring 130 tends to thermally expand outwardly greater than the susceptor ring support member 128. Accordingly, as the susceptor ring 130 thermally expands, the contact members 144 of the pins 140 may slide radially inwardly within the corresponding detent 158 of the susceptor ring 130. The sliding of the contact members 144 of the susceptor ring support member 128 allows the susceptor ring 130 to thermally expand while also allowing the aperture 154 of the susceptor ring 130 to remain substantially centered about the susceptor 116. However, if at least one of the detents 158 of the susceptor ring 130 were not configured to allow the susceptor ring 130 to thermally expand in a radial distance greater than the susceptor ring support member 128, then the susceptor ring 130 would become off-center with respect to the susceptor 116 and the gap between the susceptor ring 130 and the susceptor 116 would not be substantially even about the entire outer edge of the susceptor. When the aperture 154 about the susceptor 116 becomes off-center, the heating profile of the susceptor and substrate 118 becomes uneven, thereby affecting the deposition characteristics on the substrate 118.

The self-centering susceptor ring assembly 114 is centered about the substrate support assembly 112 within the reaction chamber 110. The susceptor ring support member 128 operatively connects the susceptor ring 130 to the reaction chamber 110 while also supporting the susceptor ring 130 in a spaced-apart relationship relative to the susceptor 116. As the temperature within the reaction chamber 110 increases or decreases, the susceptor ring 130 thermally expands or contracts relative to the susceptor 116. The connection between the pins 140 of the susceptor ring support member 128 and the corresponding detents formed in the susceptor ring 130 allow the susceptor ring 130 to thermally expand or contract relative to the susceptor 116 such that the gap between the susceptor 116 and the susceptor ring 130 remains substantially even. Each pin 140 is free to slide within a corresponding detent 158 as the susceptor ring 130 expands or contracts more than the susceptor ring support member 128, wherein the pins 140 slide in a radial manner relative to the center point of the susceptor 116 to ensure substantially even radial expansion of the susceptor ring 130 relative to the center of the susceptor 116. It should be understood by one skilled in the art that each pin 140 is independently slidable within the corresponding detent 158 to allow thermal expansion of the localized portion of the susceptor ring 130 around the detent 158. Although the above description indicates that the pins 140 slide within the detents 158, it should be understood by one skilled in the art that it is the increased radially outward thermal expansion of the susceptor ring 130 relative to the susceptor ring support member 128 that causes the pins 140 to slide within the detents 158. In other words, even though both the susceptor ring 130 and the susceptor ring support member 128 are both thermally expanding radially outward, the susceptor ring 130 is thermally expanding at a faster and greater rate such that the susceptor ring 130 is sliding past the pins 140 of the susceptor ring support member 128, wherein the relative location of the pins 140 within the detents 158 changes and such change in position is accomplished by the pins 140 sliding within the detents 158 or the detents 158 sliding relative to the pins 140.

While preferred embodiments of the present invention have been described, it should be understood that the present invention is not so limited and modifications may be made without departing from the present invention. The scope of the present invention is defined by the appended claims, and all devices, process, and methods that come within the meaning of the claims, either literally or by equivalence, are intended to be embraced therein.

What is claimed is:

1. A self-centering susceptor ring assembly comprising:
    a susceptor ring support member comprising an opening and at least three pins extending from said susceptor ring support member; and
    a susceptor ring supportable upon said susceptor ring support member, said susceptor ring including:
        a generally rectangular outer perimeter including a leading edge and a trailing edge;
        at least three detents formed into a bottom surface of said susceptor ring; and
        an aperture having a center point, wherein each of said detents receives one of said at least three pins, wherein said aperture is configured such that said susceptor ring can surround a susceptor and said aperture is positioned asymmetrically such that said center point of said aperture is positioned closer to said leading edge than said trailing edge;
        wherein each of said three detents comprises an elongated slot extending radially with respect to said center point of said aperture and wherein said detents are evenly spaced about said aperture;
    wherein thermal expansion and contraction of said susceptor ring and said susceptor ring support member causes said pins to slide within said evenly spaced detents such that an edge forming said aperture remains centered about said center point of said aperture during thermal expansion and contraction of said susceptor ring.

2. The self-centering susceptor ring assembly of claim 1, wherein said detents are formed through only a portion of a thickness of said susceptor ring.

3. The self-centering susceptor ring assembly of claim 1, wherein said susceptor ring is formed of graphite and said susceptor ring support member is formed of quartz.

4. The self-centering susceptor ring assembly of claim 1, wherein said susceptor ring support member is formed of a different material than said susceptor ring.

5. The self-centering susceptor ring assembly of claim 1, wherein said edge forming said aperture is spaced-apart from an outer edge of said susceptor to form a gap therebetween.

6. The self-centering susceptor ring assembly of claim 5, wherein said gap remains even between said susceptor ring and said susceptor when said susceptor ring and said susceptor ring support member thermally expand and contract.

7. The self-centering susceptor ring assembly of claim 1 wherein each of said pins is independently slidable during thermal expansion and contraction of said susceptor ring.

8. The self-centering susceptor ring assembly of claim 1, further comprising more than three detents formed into the bottom surface.

9. The self-centering susceptor ring assembly of claim 1, wherein the ring support member comprises one or more locating members extending from a lower surface of the ring support member, wherein the locating members are configured to connect and space the susceptor ring support member from a base of a reaction chamber.

* * * * *